(12) United States Patent
Hsu et al.

(10) Patent No.: US 9,436,896 B2
(45) Date of Patent: Sep. 6, 2016

(54) CHIP CARD HOLDER AND PORTABLE ELECTRONIC DEVICE WITH SAME

(71) Applicant: Chiun Mai Communication Systems, Inc., New Taipei (TW)

(72) Inventors: Wei-Chih Hsu, New Taipei (TW); Yu-Wei Huang, New Taipei (TW); Chia-Ju Lin, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 11 days.

(21) Appl. No.: 14/582,834

(22) Filed: Dec. 24, 2014

(65) Prior Publication Data
US 2015/0201518 A1     Jul. 16, 2015

(30) Foreign Application Priority Data

Jan. 16, 2014   (CN) .......................... 2014 1 0018721

(51) Int. Cl.
| | |
|---|---|
| H05K 5/00 | (2006.01) |
| H01R 13/52 | (2006.01) |
| H05K 5/02 | (2006.01) |
| G06K 13/08 | (2006.01) |
| H05K 7/14 | (2006.01) |
| H04B 1/3816 | (2015.01) |
| H04M 1/18 | (2006.01) |
| H04B 1/3818 | (2015.01) |

(52) U.S. Cl.
CPC ......... *G06K 13/0831* (2013.01); *H04B 1/3816* (2013.01); *H04M 1/18* (2013.01); *H05K 7/1461* (2013.01); *H04B 1/3818* (2015.01)

(58) Field of Classification Search
CPC .... H05K 7/1418; H05K 7/14; H05K 7/1461; H05K 5/0095; H05K 5/0092; H05K 5/0286; H05K 5/0217; H05K 5/0208; H04B 1/3816; H04B 1/3818; H04M 1/18; H01H 9/04; H01H 2009/048; G06K 13/0831; G06K 13/0868; G06F 1/1656; H01R 13/5219; H01R 13/62994; H01R 13/52; H01R 13/62988; H01R 13/629
USPC ....... 361/807, 725, 726, 727, 737, 754, 752, 361/756, 679.01, 747, 748; 248/220.22, 248/309.1

See application file for complete search history.

(56) References Cited

U.S. PATENT DOCUMENTS

| | | | | |
|---|---|---|---|---|
| 8,625,287 B2* | 1/2014 | Liu | ...................... | G06F 1/1656 361/726 |
| 2013/0114225 A1* | 5/2013 | Schack | ................ | H05K 5/0208 361/781 |
| 2013/0335896 A1* | 12/2013 | Gao | ...................... | H05K 7/1461 361/679.01 |
| 2014/0002971 A1* | 1/2014 | Chung | ................. | H05K 5/0286 361/679.01 |
| 2014/0029211 A1* | 1/2014 | Gao | ...................... | H05K 5/0091 361/747 |
| 2014/0218877 A1* | 8/2014 | Wei | ...................... | H04B 1/3816 361/752 |

\* cited by examiner

*Primary Examiner* — Dimary Lopez Cruz
(74) *Attorney, Agent, or Firm* — Zhigang Ma

(57) ABSTRACT

A chip card holder includes a tray and a protecting member. The tray includes a receiving portion and a handle portion. The receiving portion is configured to receive a chip card. The handle portion is positioned at a side of the receiving portion. The protecting member is sleeved on the receiving portion and resists the handle portion. The protecting member is made of elastic material so as to prevent outside contamination from entering the chip card holder.

15 Claims, 6 Drawing Sheets

CHIP CARD HOLDER AND PORTABLE ELECTRONIC DEVICE WITH SAME

CROSS-REFERENCE TO RELATED APPLICATIONS

This application claims priority to Chinese Patent Application No. 201410018721.5 filed on Jan. 16, 2014, the contents of which are incorporated by reference herein.

FIELD

The subject matter herein generally relates to a chip card holder and a portable electronic device with the chip card holder.

BACKGROUND

Chip cards are widely used in portable electronic devices, such as mobile phones, to enhance or specialize the functions of the portable electronic devices. Generally, the chip card is removed from a casing of the portable electronic device by a pin inserted through a pin hole of the casing to eject the chip card. However, electronic elements inside of the portable electronic device are easily damaged if outside contamination, such as water, vapor or dust enters the portable electronic device through the pin hole of the casing.

BRIEF DESCRIPTION OF THE DRAWINGS

Implementations of the present technology will now be described, by way of example only, with reference to the attached figures.

DETAILED DESCRIPTION

Figure 1:
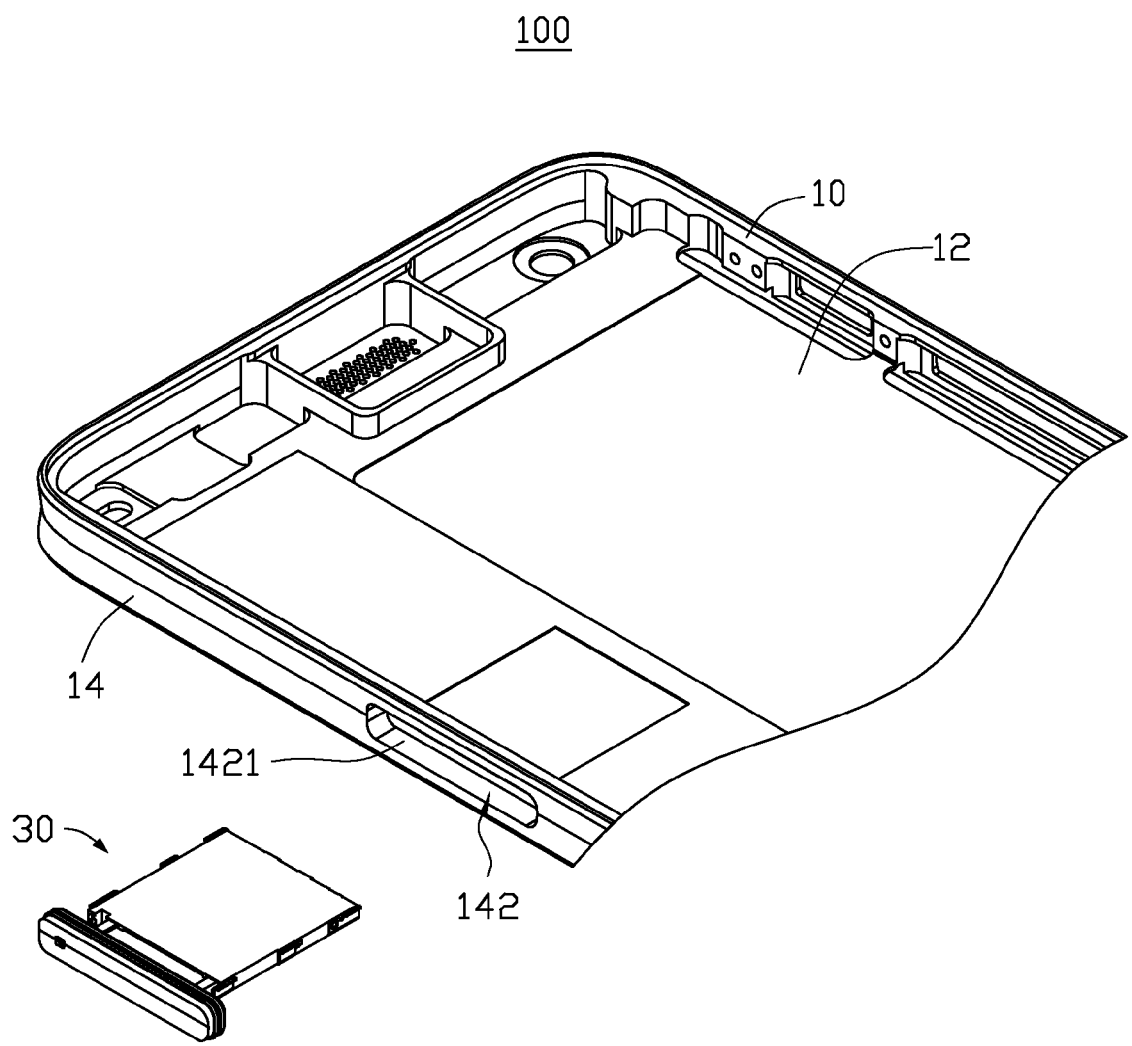
FIG. 1 is an exploded, isometric view of an embodiment of a portable electronic device having a chip card holder.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

FIG. 1 illustrates an embodiment of a portable electronic device 100. The portable electronic device 100 may be a mobile phone or any portable electronic device using a chip card 200 (shown in FIG. 2). The chip card 200 can be a subscriber identity module (SIM) card, a memory card, or a multimedia card (MMC). The portable electronic device 100 includes a main body 10 and a chip card holder 30.

The main body 10 is configured to receive the chip card holder 30 and includes a bottom wall 12 and a peripheral wall 14. The peripheral wall 14 extends substantially perpendicularly from a periphery of the bottom wall 12. A through hole 142 is defined at a side of the peripheral wall 14. The through hole 142 has a resisting surface 1421.

Figure 2:
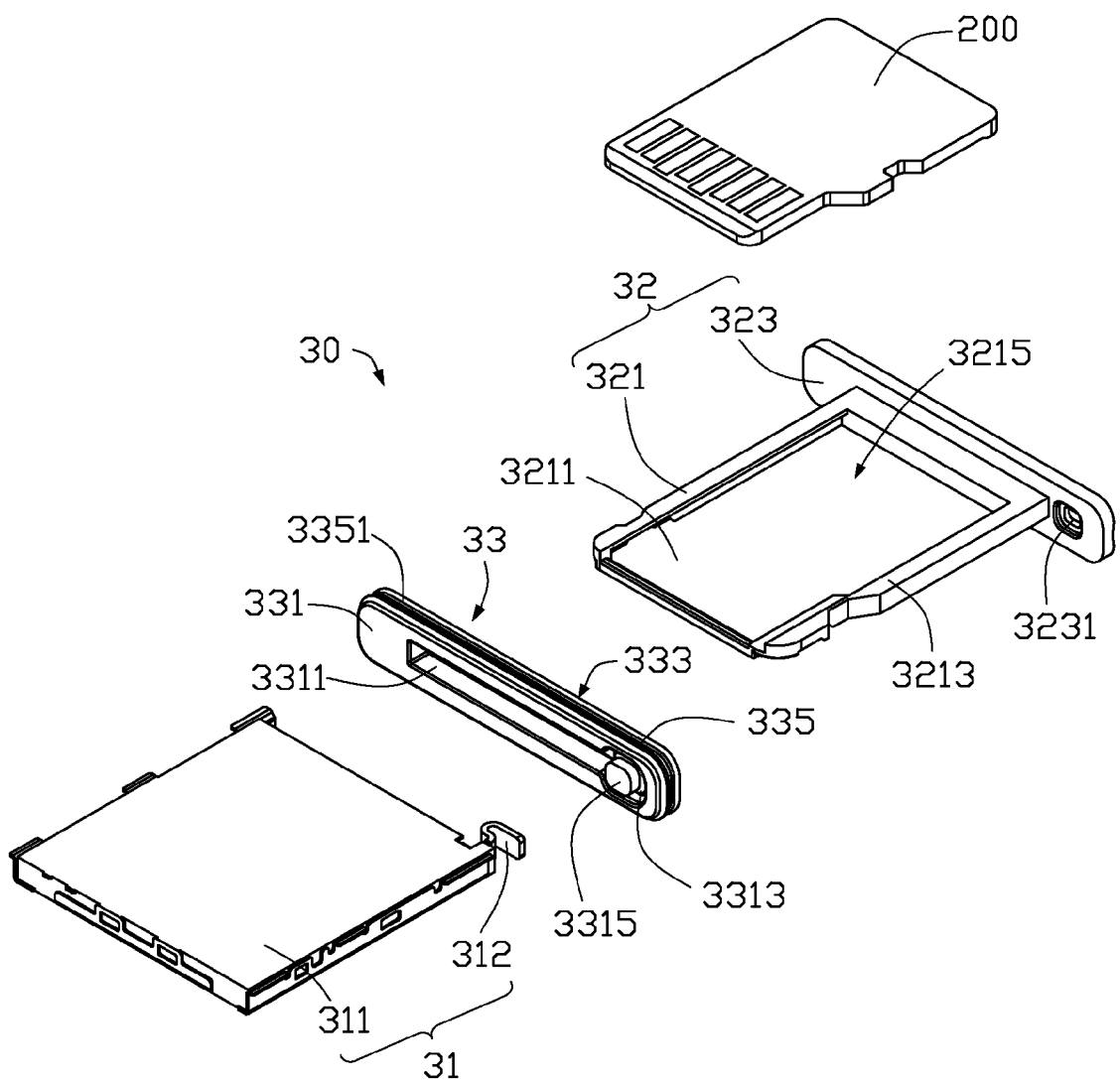
FIG. 2 is an exploded, isometric view of the chip card holder of FIG. 1.

FIG. 2 illustrates that the chip card holder 30 includes a mounting member 31, a tray 32, and a protecting member 33. The mounting member 31 includes a mounting portion 311 and an elastic portion 312. The mounting portion 311 is substantially a frame and forms a receiving recess 3112 (shown in FIG. 4) for receiving the tray 32. The elastic portion 312 is positioned at a side of the mounting portion 311 adjacent to an entrance of the receiving recess 3112. In this embodiment, the elastic portion 312 is configured to resist the protecting member 33 and help a chip card ejecting structure, for example, a pin or a post, to pull the tray 32 out from the mounting member 31.

The tray 32 is slidably positioned in the receiving recess 3112. The tray 32 is configured to support the chip card 200 and bring the chip card 200 into or out of the receiving recess 3112. The tray 32 includes a receiving portion 321 and a handle portion 323. The receiving portion 321 includes a bottom plate 3211 and a number of side edges 3213. The side edges 3213 extend substantially perpendicularly from a periphery of the bottom plate 3211 and define an accommodating space 3215 with the bottom plate 3211 for accommodating the chip card 200.

The handle portion 323 is perpendicularly mounted to a side of one of the side edges 3213. The handle portion 323 is configured to seal the through hole 142 when the tray 32 is inserted into the through hole 142 and is received in the receiving recess 3112. An end of the handle portion 323 facing the receiving portion 321 defines a mounting slot 3231. A middle portion of the mounting slot 3231 defines a pin hole 3232 (shown in FIG. 3).

The protecting member 33 can be made of elastic material. In this embodiment, the protecting member 33 is made of rubber. The protecting member 33 is sleeved in the receiving portion 321 and abuts the handle portion 323. The protecting member 33 includes a first surface 331, a second surface 333 opposite to the first surface 331, and a connecting surface 335. A middle portion of the first surface 331 defines an assembling hole 3311 for allowing the tray 32 passing through the protecting member 33. An end of the first surface 331 adjacent to the assembling hole 3311 defines a receiving hole 3313. A resisting portion 3315 is positioned in the receiving hole 3313 and respectively protrudes from the first surface 331 and the second surface 333. The connecting surface 335 is connected substantially perpendicular to peripheries of the first surface 331 and the second surface 333. At least one flange 3351 is protruded from the connecting surface 335. In this embodiment, there are two flanges 3351 protruded from the connecting surface 335 and spaced apart from each other.

Figure 3:
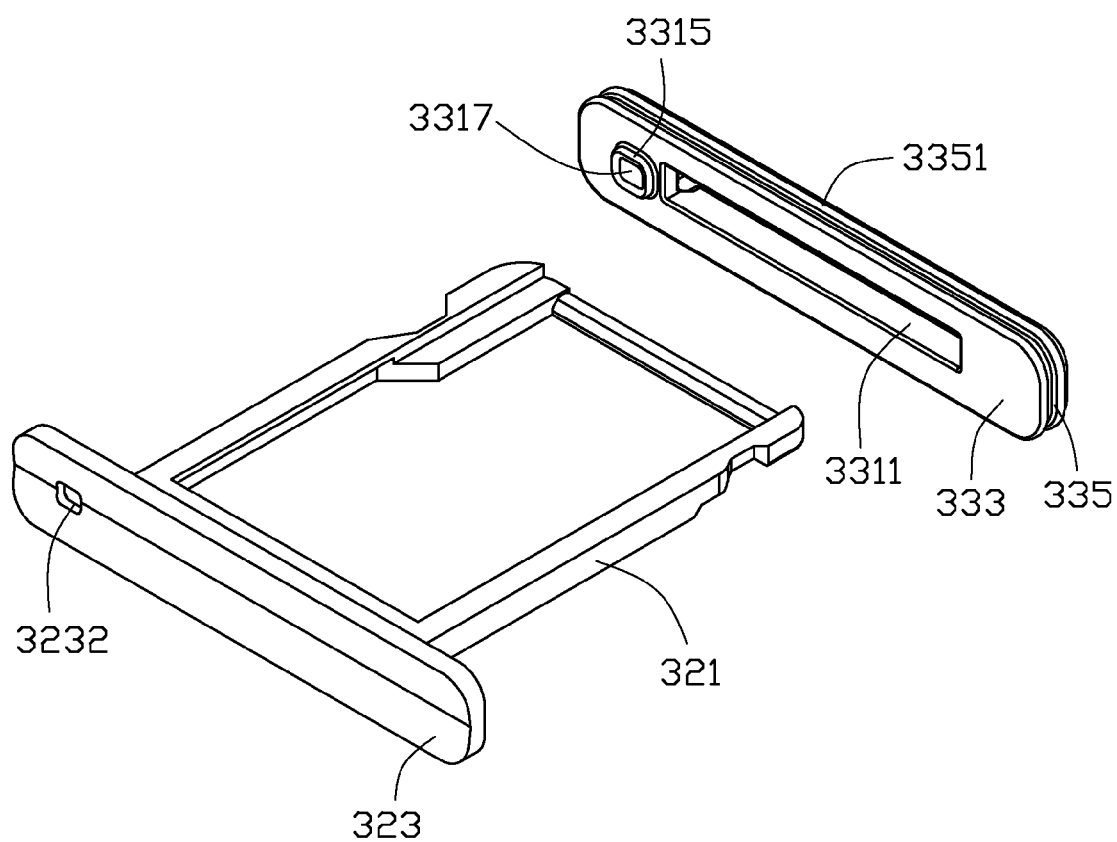
FIG. 3 is a partially exploded, isometric view of the chip card holder of FIG. 2.

FIG. 3 illustrates that a receiving slot 3317 is recessed from an end of the resisting portion 3315 positioned at the second surface 333. When the protecting member 33 resists the handle portion 323, the end of the resisting portion 3315 defining the receiving slot 3317 is received in the mounting slot 3231 and the receiving slot 3317 is communicated with the pin hole 3232. Then, the outside contamination, such as water, vapor and dust, can be prevented from entering the portable electronic device 100 through the pin hole 3232 and the receiving slot 3317.

Figure 4:
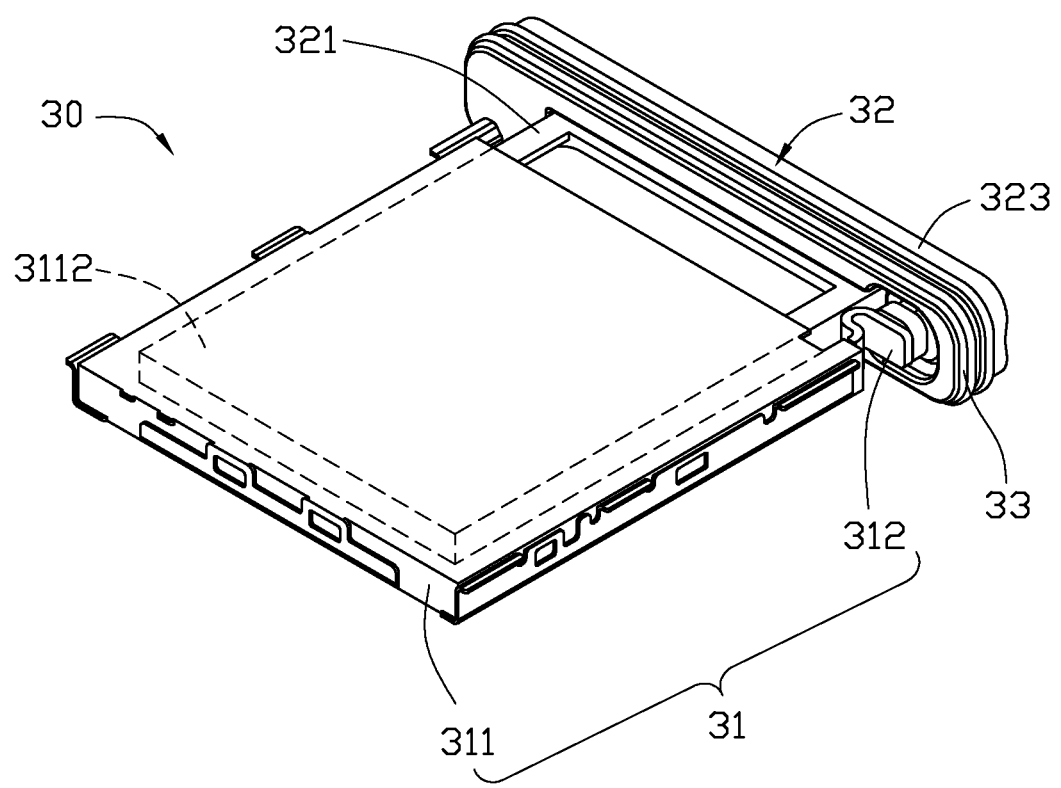
FIG. 4 is an assembled, isometric view of the chip card holder of FIG. 2.
Figure 5:
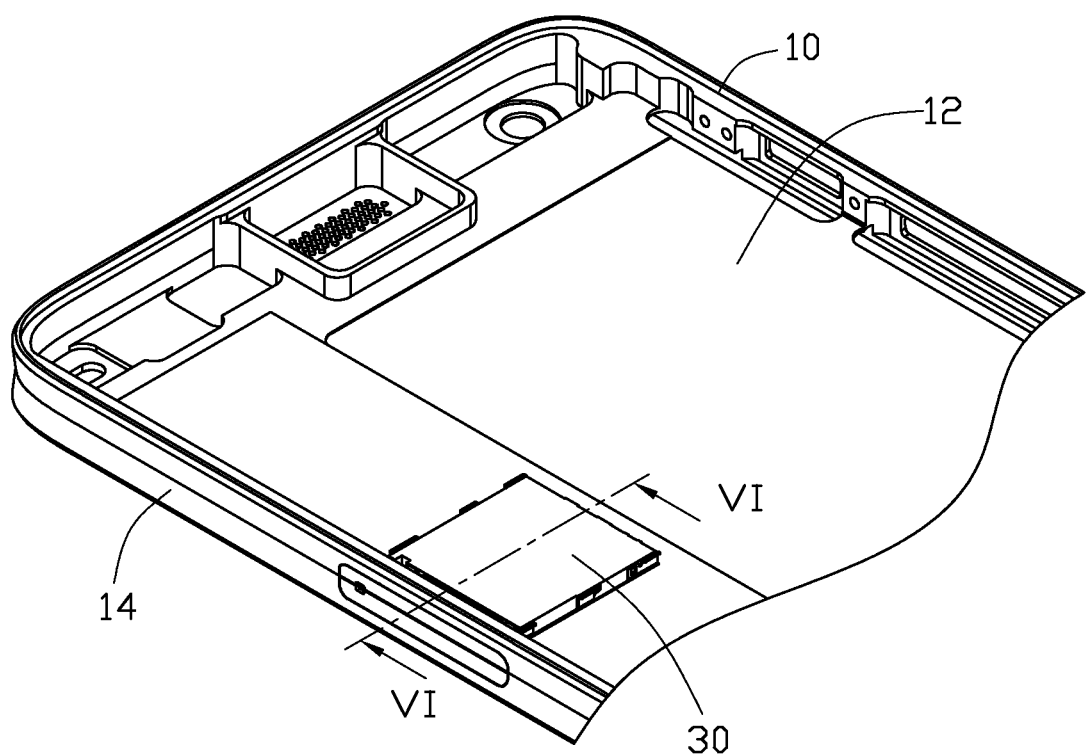
FIG. 5 is an assembled, isometric view of the portable electronic device of FIG. 1.

Referring to FIGS. 4-5, in assembly, the mounting portion 311 of the mounting member 31 is mounted to the bottom wall 12 of the main body 10. The receiving recess 3112 is aligned with and is communicated with the through hole 142. The protecting member 33 is sleeved on the receiving portion 321 of the tray 32 and abuts the handle portion 323. Then, the handle portion 323 of the tray 32 seals the assembling hole 3311 of the receiving portion 321, the end of the resisting portion 3315 defining the receiving slot 3317 is received in the mounting slot 3231, and the receiving slot 3317 is communicated with the pin hole 3232. Thus, the outside contamination, such as water, vapor and dust, can be prevented from entering the portable electronic device 10 through the pin hole 3232 and the receiving slot 3317.

The chip card 200 is inserted into the accommodating space 3215. The tray 32 with the chip card 200 and the protecting member 33 is aligned with the through hole 142. The tray 32 is pushed towards the through hole 142 until the receiving portion 321 with the chip card 200 is received in the receiving recess 3112 and the handle portion 323 is received in the through hole 142. Then, the end of the resisting portion 3315 positioned at the first surface 331 resists the elastic portion 312 of the mounting member 31.

Figure 6:
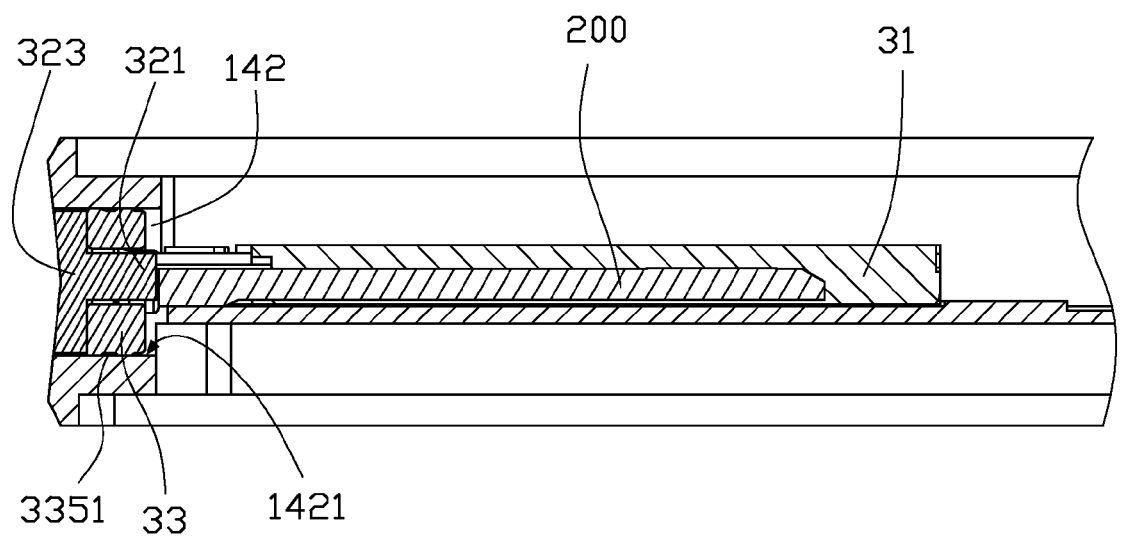
FIG. 6 is a cross-sectional view taken along line VI-VI of FIG. 5.

FIG. 6 illustrates that when the tray 32 and the protecting member 33 are received in the main body 10, the flanges 3351 of the protecting member 33 is compressed and resists the resisting surface 1421, thereby outside contamination, such as water, vapor and dust, can be also prevented from entering the portable electronic device 10 through the through hole 142.

To remove the chip card 200, a pin (not shown) is inserted through the pin hole 3232 of the handle portion 323 and resists the second slot 3317. The elastic portion 312 is compressed towards the mounting portion 311. Then, the pin is taken out of the pin hole 3232 and the accumulated restoring force of the elastic portion 312 is released against the resisting portion 3315, thereby making the protecting member 33 to remove and enabling the tray 32 to be ejected out of the receiving recess 3112 under the force of the elastic portion 312.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A chip card holder comprising:
   a tray comprising a receiving portion for receiving a chip card and a handle portion positioned at a side of the receiving portion, the handle portion defining a mounting slot; and
   a protecting member sleeved on the receiving portion and resisting the handle portion;
   wherein the protecting member is made of elastic material and comprises a first surface, a second surface opposite to the first surface, and a resisting portion, one end of the first surface defining a receiving hole, the resisting portion is positioned in the receiving hole and respectively protrudes from the first surface and the second surface, one end of the resisting portion protruding from the first surface resists a mounting member, and another end of the resisting portion protruding from the second surface is received in the mounting slot to prevent outside contamination from entering the chip card holder.

2. The chip card holder of claim 1, wherein a middle portion of the mounting slot defines a pin hole, a second end of the resisting portion protruding from the second surface defines a receiving slot, the receiving slot is aligned with the mounting slot and is communicated with the pin hole.

3. The chip card holder of claim 1, wherein a middle portion of the first surface defines an assembling hole for allowing the receiving portion of the tray passing through the protecting member.

4. The chip card holder of claim 1, wherein the protecting member further comprises a connecting surface, the connecting surface is connected substantially perpendicular to peripheries of the first surface and the second surface, and at least one flange is protruded from the connecting surface.

5. The chip card holder of claim 1, further comprising a mounting member, wherein the receiving portion is slidably received in the mounting member.

6. The chip card holder of claim 5, wherein the mounting member comprises a mounting portion, the mounting portion forming a receiving recess for receiving the tray.

7. The chip card holder of claim 6, wherein the mounting member further comprises an elastic portion, the elastic portion is positioned at a side of the mounting portion adjacent to an entrance of the receiving recess, one end of the resisting portion protruding from the first surface resists the elastic portion.

8. A portable electronic device comprising:
   a main body defining a through hole; and
   a chip card holder received in the main body and aligned with the through hole; the chip card holder comprising:
      a tray comprising a receiving portion for receiving a chip card and a handle portion positioned at a side of the receiving portion, the handle portion defining a mounting slot; and
      a protecting member sleeved on the receiving portion and resisting the handle portion;
   wherein the protecting member is made of elastic material and comprises a first surface, a second surface opposite to the first surface, and a resisting portion, one end of the first surface defining a receiving hole, the resisting portion is positioned in the receiving hole and respectively protrudes from the first surface and the second surface, one end of the resisting portion protruding from the first surface resists a mounting member, and another end of the resisting portion protruding from the second surface is received in the mounting slot to prevent outside contamination from entering the chip card holder.

9. The portable electronic device of claim 8, wherein a middle portion of the mounting slot defines a pin hole, a second end of the resisting portion protruding from the second surface defines a receiving slot, the receiving slot is aligned with the mounting slot and is communicated with the pin hole.

10. The portable electronic device of claim 8, wherein a middle portion of the first surface defines an assembling hole for allowing the receiving portion of the tray passing through the protecting member.

11. The portable electronic device of claim 8, wherein the protecting member further comprises a connecting surface, the connecting surface is connected substantially perpendicular to peripheries of the first surface and the second surface, and at least one flange is protruded from the connecting surface.

12. The portable electronic device of claim 11, wherein the main body comprising a bottom wall and a peripheral wall; the peripheral wall extends substantially perpendicularly from a periphery of the bottom wall and defines a through hole; the through hole has a resisting surface and the at least one flange resists the resisting surface.

13. The portable electronic device of claim 8, further comprising a mounting member, wherein the receiving portion is slidably received in the mounting member.

14. The portable electronic device of claim 13, wherein the mounting member comprises a mounting portion, the mounting portion forming a receiving recess for receiving the tray.

15. The portable electronic device of claim 14, wherein the mounting member further comprises an elastic portion, the elastic portion is positioned at a side of the mounting portion adjacent to an entrance of the receiving recess, one end of the resisting portion protruding from the first surface resists the elastic portion.

* * * * *